United States Patent
Thapliyal et al.

(10) Patent No.: US 10,868,534 B2
(45) Date of Patent: Dec. 15, 2020

(54) ADIABATIC LOGIC-IN-MEMORY ARCHITECTURE

(71) Applicant: University of Kentucky Research Foundation, Lexington, KY (US)

(72) Inventors: Himanshu Thapliyal, Lexington, KY (US); S. Dinesh Kumar, Lexington, KY (US)

(73) Assignee: University of Kentucky Research Foundation, Lexington, KY (US)

( * ) Notice: Subject to any disclaimer, the term of this patent is extended or adjusted under 35 U.S.C. 154(b) by 0 days.

(21) Appl. No.: 16/034,255

(22) Filed: Jul. 12, 2018

(65) Prior Publication Data
US 2020/0021290 A1  Jan. 16, 2020

(51) Int. Cl.
*H03K 19/00* (2006.01)
*H03K 19/0185* (2006.01)
*G06F 7/501* (2006.01)

(52) U.S. Cl.
CPC ......... *H03K 19/0019* (2013.01); *G06F 7/501* (2013.01); *H03K 19/018521* (2013.01)

(58) Field of Classification Search
CPC ........ H03K 19/0019; H03K 19/018521; G06F 7/501
See application file for complete search history.

(56) References Cited

U.S. PATENT DOCUMENTS

| | | | | |
|---|---|---|---|---|
| 2007/0057698 | A1* | 3/2007 | Verbauwhede | G06Q 20/341 327/52 |
| 2012/0200313 | A1* | 8/2012 | Kyue | H03K 19/0019 326/8 |

OTHER PUBLICATIONS

Jan M. Rabaey, "Digital Integrated Circuits, A Design Perspective", 2nd Edition, Prentice Hall, 2003, ISBN 0-13-090996-3 (Year: 2003).*

* cited by examiner

*Primary Examiner* — Seokjin Kim
(74) *Attorney, Agent, or Firm* — Crowell & Moring LLP

(57) ABSTRACT

An adiabatic logic-in-memory based complementary metal-oxide-semiconductor/magnetic-tunnel-junction (ALiM CMOS/MTJ) circuit utilizes an adiabatic logic based pre-charged sense amplifier (PCSA) to recover energy from its output load capacitors. The ALiM CMOS/MTJ includes a non-volatile magnetic-tunnel-junction (MTJ) based memory. The ALiM CMOS/MTJ also includes a dual rail complementary metal-oxide-semiconductor (CMOS) logic that performs logic operations in association with the MTJ, and thereby generates logic outputs based on logic inputs. The ALiM CMOS/MTJ also includes the adiabatic PCSA, which is operatively coupled to the dual rail CMOS logic. The adiabatic logic based PCSA includes PCSA circuitry for which an input is a multi-phase power clock, and a charge recovery circuit having the output load capacitors. The charge recovery circuit is operatively coupled to the PCSA circuitry such that the ALiM CMOS/MTJ circuit uses the power clock to recover energy from the output load capacitors.

17 Claims, 8 Drawing Sheets

ADIABATIC LOGIC-IN-MEMORY ARCHITECTURE

BACKGROUND OF THE INVENTION

The disclosed invention relates to adiabatic logic-in-memory (ALiM) based complementary metal-oxide-semiconductor (CMOS)/magnetic tunnel junction (MTJ) circuits.

The emergence of Internet-of-things (IoT) has helped in the comfort and care of human life via the rise of so-called "smart" devices in which the physical device and digital world are directly integrated to improve the overall quality of human life. Most of these devices are battery operated. As such, these devices benefit from having ultra-low-power requirements and a high energy-efficiency, as well as from being secure and reliable. However, as the CMOS technology node shrinks down to 100 nm or below, high levels of power leakage becomes an important component of overall power consumption, and thus a major concern in CMOS logic design. Indeed, with the scaling of CMOS technologies, leakage power (i.e., the power dissipated through transistors when the circuit is in an idle state) has become one of the major concerns for the circuit designers. A potential approach to reducing leakage power in CMOS based circuit design is to integrate MTJ cells and CMOS logic.

Such hybrid CMOS/MTJ circuits are known as Logic-In-Memory (LiM) circuits. These circuits have advantages such as near zero leakage power, non-volatility and high density. In general, the MTJ cells of these circuits impart an instant ON/OFF functionality to standard CMOS logic, which thereby turns the power down in standby mode (i.e., when the circuit is in idle state). This functionality helps reduce the leakage power in standard CMOS/MTJ circuits.

FIG. 1 schematically illustrates the design principles of existing LiM based CMOS/MTJ circuits 10. The LiM based CMOS/MTJ circuit includes a PCSA circuit 20, a dual rail CMOS logic tree 30 and a non-volatile MTJ based memory 40. FIG. 2 schematically illustrates the operation of existing LiM based CMOS/MTJ circuits by way of an illustrative LiM based CMOS/MTJ XOR gate 12.

The LiM based CMOS/MTJ circuit receives a clock signal CLK to pre-charge the output nodes XOR and XNOR during the pre-charge phase, which will be evaluated based on the input given to the dual rail CMOS logic. The dual rail CMOS logic tree, in conjunction with the non-volatile memory, implements a desired logic function based on logic inputs A and $\overline{A}$, and B and $\overline{B}$. Since the CMOS/MTJ circuit is dual rail in nature, complementary outputs out and $\overline{out}$ are available. For example, a CMOS/MTJ based XOR circuit will output complimentary outputs XOR and XNOR. The PCSA circuit provides the complimentary outputs out and $\overline{out}$ based on the operation of the CMOS/MTJ circuit, the clock signal CLK and the power signal $V_{dd}$.

The LiM based CMOS/MTJ circuit operates according to two phases of the clock signal CLK, which reflects a square wave. When the clock signal CLK is at 0, the output nodes are abruptly charged to $V_{dd}$. When the clock signal CLK is at 1, the charge that was stored in one of the output nodes is abruptly discharged to ground.

For example, referring to FIG. 2, when the clock signal is set to ground (i.e., CLK=0), the PCSA circuit pre-charges the output nodes XOR and XNOR to 1 (i.e., the output nodes are charged to $V_{dd}$). Once the clock signal CLK is set to $V_{dd}$ (i.e., CLK=1), the output voltages start discharging to ground. However, due to the difference in resistances between the different orientations of the MTJ1 and MTJ2 (i.e., parallel versus anti-parallel), the discharge speed will be different for each branch.

For example, if the MTJ1 is configured in anti-parallel configuration and MTJ2 is configured in parallel configuration, then $R_{MTJ1} > R_{MTJ2}$. Due to the difference in resistances between $R_{MTJ1}$ and $R_{MTJ2}$, the discharge current through MTJ2 will be greater than through MTJ1. Thus, when XNOR becomes less than the threshold switching voltage of the inverter comprised of: MP2 and MN2, XOR will be charged to 1 (i.e., $V_{dd}$) and XNOR will be discharged to 0 (i.e., ground). In other words, when CLK=0, transistors MP3 and MP4 are turned ON and the outputs XOR and XNOR are pre-charged to $V_{dd}$. When CLK=1, MP3 and MP4 are turned OFF.

Thus, depending on the input to the dual rail CMOS logic tree and the MTJs, one of the discharging paths will have lower resistance than the other. For example, when A=1 and B=0, transistor T1 and T4 are OFF while T2 and T3 are ON. MTJ1 (anti-parallel configuration) will have higher resistance as compared to MTJ2 (parallel configuration). The charge stored at the XNOR output will therefore discharge faster than the charge stored at the XOR output through transistor T3 and MTJ2, which in turn leads the XOR output to be at $V_{dd}$ (i.e., logic "1") while charge at XNOR output will be discharged to ground (i.e., logic "0").

In the illustrative example, during the pre-charge phase, $\frac{1}{2}CV_{dd}^2$ Joules of energy is dissipated and $\frac{1}{2}CV_{dd}^2$ Joules of energy will be dissipated during the evaluate phase. In total, $CV_{dd}^2$ J of energy will be dissipated per cycle in conventional PCSA based MTJ/CMOS circuits.

Thus, it is observed that, while LiM based CMOS/MTJ circuits have nearly zero leakage power dissipation, a high supply voltage ($V_{dd}$) is required in both writing and sensing operations of the LiM based CMOS/MTJ circuits, which leads to the consumption of a considerable amount of energy, further leading to reduced energy-efficiency. Scaling down the $V_{dd}$ has been considered to meet the power budget in low-power electronic devices. However, scaling down the $V_{dd}$ leads to increase in leakage power, and the effectiveness of $V_{dd}$ scaling also declines at a point where further reduction in $V_{dd}$ leads to an incorrect circuit operation or a decrease in the energy-efficiency of the circuit.

Adiabatic logic is a low power circuit design technique for designing energy-efficient, i.e., low-power, hardware. Adiabatic logic circuits use power clocks to recover the energy from each node of the circuit after computing the inputs, i.e., to effectively recycle the charge stored in the load capacitor. Recovery of energy after the computation makes adiabatic logic circuits more energy-efficient compared to conventional CMOS circuits, and adiabatic logic circuits have reduced dynamic switching energy loss.

Unlike conventional CMOS logic, in adiabatic logic circuits, the output load capacitors CL1 and CL2 are slowly charged and slowly discharged. During the evaluate phase of a multiphase clock signal $V_{pc}$, the output load capacitors either CL1 or CL2 are slowly charged to $V_{dd}$ depending on the functions F and $\overline{F}$. During the recover phase, the charge stored in CL1 or CL2 is slowly recovered back to $V_{pc}$, thereby gaining energy-efficiency compared to conventional CMOS logic. Adiabatic logic therefore uses the multi-phase clock signal $V_{pc}$) to recover the charge from each node of the load capacitance.

The instant invention applies the energy recovery property of adiabatic logic circuits in hybrid CMOS/MTJ based circuit designs so as to provide an adiabatic logic-in-memory architecture (ALiM) for ultra-low-power CMOS/

MTJ circuits. In so providing, aspects of the invention exploit the commonality of both adiabatic logic circuits and PCSAs within CMOS/MTJ circuits. The disclosed ALiM based CMOS/MTJ circuits designed according to the principles of the instant invention have reduced dynamic power consumption as compared to existing CMOS/MTJ circuits. It is believed that this advantage is due to the minimization of both dynamic power through the adiabatic logic as well as power leakage through the MTJ.

The disclosed embodiments thus provide for minimizing the power consumption of consumer electronic devices via circuits that are more energy efficient and require less power when compared to existing approaches.

Other features and advantages of the present invention will become apparent from the following more detailed description, taken in conjunction with the accompanying drawings, which illustrate, by way of example, the principles of the presently described embodiments.

BRIEF DESCRIPTION OF THE DRAWING(S)

FIG. 1 schematically illustrates the design principles of existing LiM based CMOS/MTJ circuits;

FIG. 2 schematically illustrates an existing LiM based CMOS/MTJ XOR gate;

FIG. 3 schematically illustrates the design principles of an ALiM based CMOS/MTJ circuit in accordance with at least one embodiment of the instant invention;

FIG. 4 is an exemplary time diagram for the ALiM based CMOS/MTJ circuits in accordance with at least one embodiment of the instant invention;

FIG. 5 schematically illustrates an ALiM based CMOS/MTJ circuit in accordance with at least one embodiment of the instant invention;

FIGS. 6A-B schematically illustrate the operation of the ALiM based XOR gate during the evaluate phase, in accordance with at least one embodiment of the instant invention;

FIGS. 7A-B schematically illustrate the operation of the ALiM based XOR gate during the recover phase, in accordance with at least one embodiment of the instant invention FIG. 8 schematically illustrates an ALiM Magnetic Full Adder in accordance with at least one embodiment of the instant invention;

Figure 13:
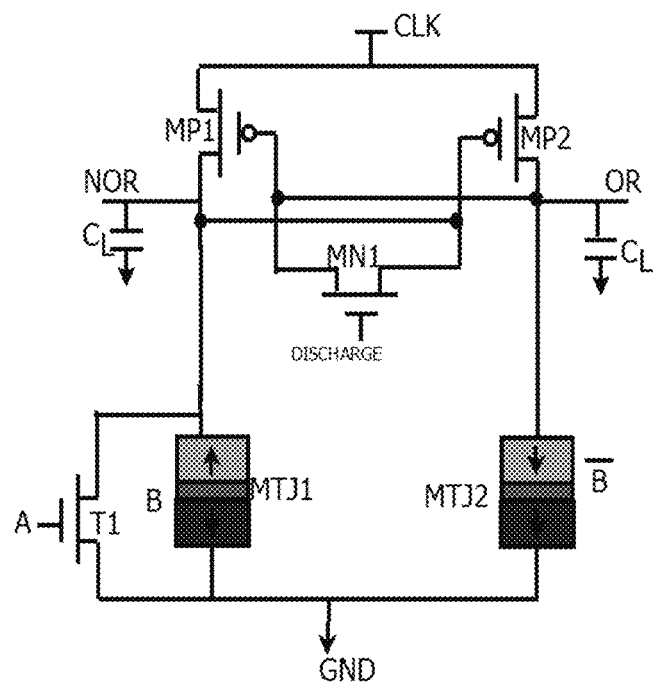
Figure 14:
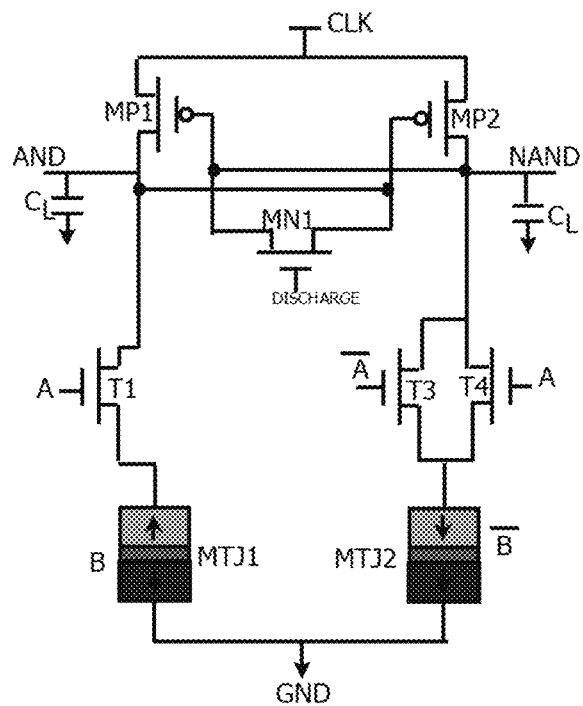
Figure 15:
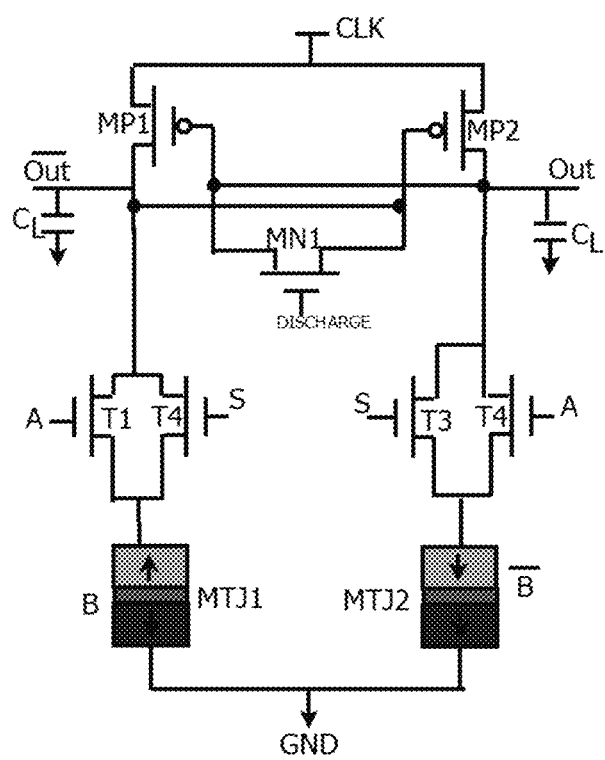

FIG. 13 schematically illustrates an ALiM OR gate in accordance with at least one embodiment of the instant invention;

FIG. 14 schematically illustrates an ALiM AND gate in accordance with at least one embodiment of the instant invention; and FIG. 15 schematically illustrates ALiM multiplexer in accordance with at least one embodiment of the instant invention.

DETAILED DESCRIPTION OF THE PREFERRED EMBODIMENTS

The above described drawing figures illustrate the disclosed invention in at least one embodiment, which is further defined in detail in the following description. Those having ordinary skill in the art may be able to make alterations and modifications to what is described herein without departing from its spirit and scope. While the invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspects of the invention to any embodiment illustrated. Therefore, it should be understood that what is illustrated is set forth only for the purposes of example and should not be taken as a limitation on the scope of the disclosed invention.

Figure 1:
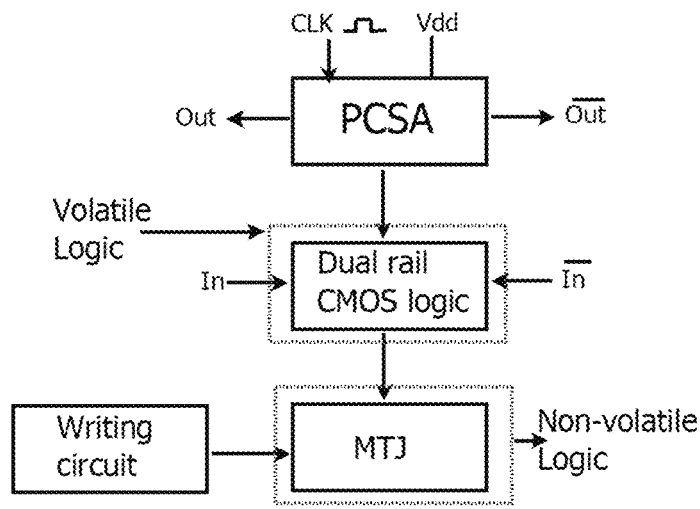
Figure 2:
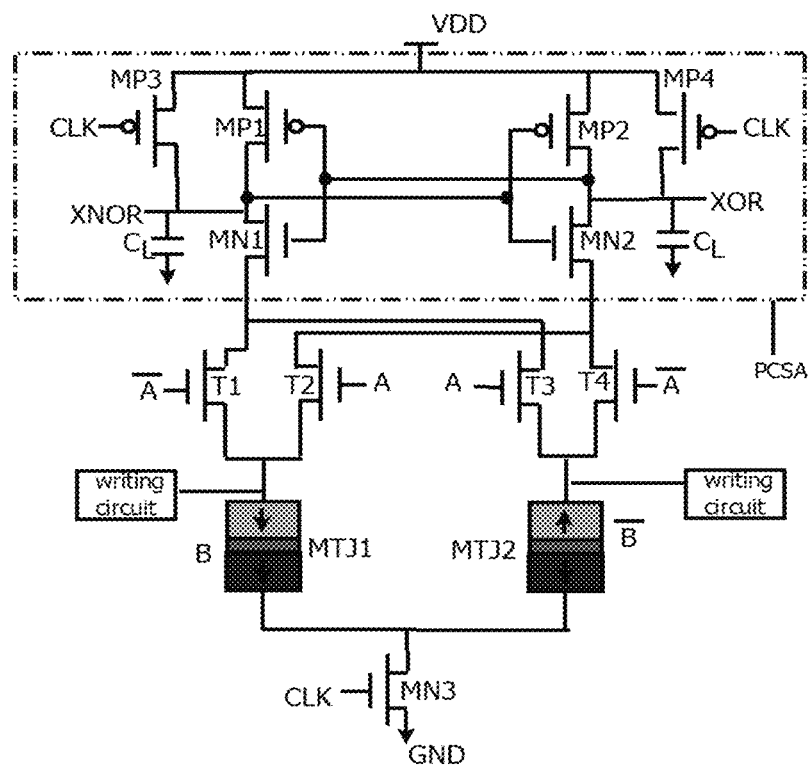
Figure 3:
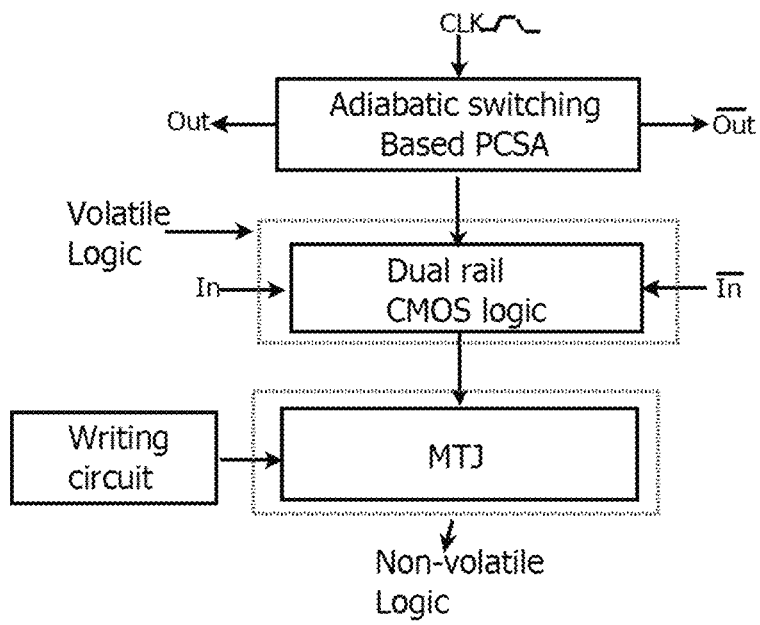

FIG. 3 schematically illustrates the design principles of an ALiM based CMOS/MTJ circuit 100 in accordance with the instant invention. The ALiM CMOS/MTJ circuit comprises an adiabatic logic based PCSA circuit 200, a dual rail CMOS logic tree 300 and a non-volatile MTJ based memory 400. In contrast to LiM based MTJ/CMOS circuits described above, the ALiM based CMOS/MTJ circuit of the instant invention does not abruptly switch from ground (i.e., logic=0) to $V_{dd}$ (i.e., logic=1). Rather, a voltage ramp is used, via a multi-phase clock signal VCLK, to slowly charge and recover the energy from the output.

The non-volatile logic or memory, preferably comprising a plurality of MTJs, is configured to store non-volatile data. In particular, the non-volatile memory is configured to store one-bit (i.e., binary) data. Although a single MTJ based memory is shown for illustration of the principles of the invention, a plurality of MTJ based memories may be utilized without departing from the scope of the invention.

The dual rail CMOS logic is operatively coupled to the non-volatile memory, and is configured to perform desired logic operations in association with the non-volatile memory. The CMOS logic may be any CMOS logic, including one or more of: NOT, AND, OR, NAND, NOR, XOR and XNOR, MUX, inverter, encoder, decoder, full and half adder, full and half subtractor, D flip-flop, and other known logic, configured to perform the desired logical operations. Since the MTJ/CMOS based circuits are dual rail in nature, the complementary outputs are available as one of the output. For example, a XOR based MTJ/CMOS circuit will also include an XNOR output.

The adiabatic logic based PCSA circuit is a modified PCSA circuit that includes a charge recovery circuit such that the ALiM based CMOS/MTJ circuit uses the power clock VCLK to recover the energy from its output load capacitors. This is in contrast to typical LiM based CMOS/MTJ circuits, which use constant voltage inputs $V_{dd}$ and do not recover energy from their load capacitors. Accordingly, the data stored in the non-volatile memory is sensed and held by the adiabatic logic based PCSA, while the adiabatic logic based PCSA also acts to recover the charge from the output capacitors of the ALiM based CMOS/MTJ circuit.

The inputs to the dual rail CMOS logic tree and the non-volatile memory are the logic inputs and their complements to the CMOS logic functions, A, $\overline{A}$, B and $\overline{B}$. The input to the adiabatic logic based PCSA is a multi-phase clock signal VCLK. The multi-phase clock signal may be of: type two phase, type three-phase, type four-phase clock, etc. The adiabatic logic based PCSA employs the multi-phase clock to slowly charge the load capacitors and to recover the energy from the load capacitance after the computation is complete for each cycle.

Figure 4:
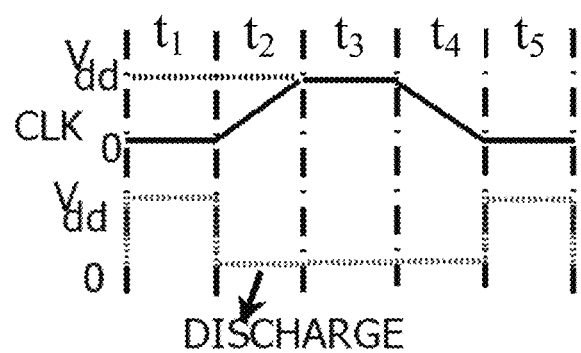

FIG. 4 is a time diagram for the ALiM based CMOS/MTJ circuits, which shows waveforms of the discharge signal DISCHARGE and the multi-phase clock signal VCLK for reference, each waveform moving between ground and the clock voltage $V_{dd}$. FIG. 4 shows the multi-phase clock signal VCLK as a four-phase clock signal which operates to slowly charge and recover the energy from the load capacitors. Further, the discharge signal DISCHARGE is utilized to discharge the reductant charge after the recovery of energy.

Figure 5:
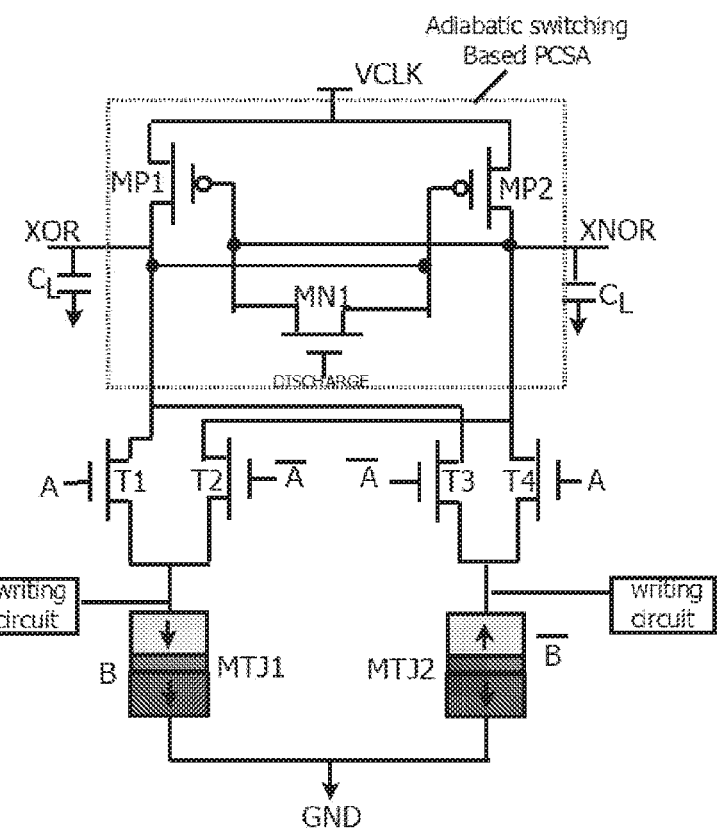

Adiabatic Logic-In-Memory XOR Gate:

FIG. 5 schematically illustrates ALiM based CMOS/MTJ circuit according to at least one embodiment in which the ALiM based CMOS/MTJ circuit is an ALiM XOR gate 120.

The dual rail CMOS logic 320 and non-volatile memory 420 implement the logic functions, while the adiabatic PCSA 220 reads the logic outputs XOR and XNOR. Due to the adiabatic logic principle, the energy dissipated in an adiabatic circuit when the charge is supplied by a constant current source is very small as compared to conventional CMOS XOR gates.

As shown in FIG. 5, transistors MP1 and MP2 are configured to charge and recover charge from the output load capacitors $C_L$. MN1 is configured to charge-share the outputs XOR and XNOR. Transistors T1, T2, T3 and T4 are configured to evaluate the inputs in performing the logic operation. Magnetic tunnel junctions MTJ1 and MTJ2 are configured to store the non-volatile data.

In particular, source terminals of transistors MP1 and MP2 are operatively coupled to the multi-phase clock that provides the multi-phase clock VCLK signal. The gate terminal of transistor MP1 is operatively coupled to the drain terminal of transistor MP2 and to the drain terminal of discharge transistor MN1. The gate terminal of transistor MP2 is operatively coupled to the drain terminal of transistor MP1 and to the source terminal of discharge transistor MN1. The gate terminal of discharge transistor MN1 set to discharge. MP1 and MP2 drain terminals are also operatively coupled to dual branch CMOS logic, and to respective outputs XOR and XNOR, including respective load capacitors $C_L$.

The ALiM based gate consists of two cross-coupled PMOS devices, transistors T1-T2 and T3-T4, and magnetic tunnel junctions MTJ1 and MTJ2, which store the information. The logic function is constructed through the dual rail CMOS logic and the MTJ devices.

In operation, for example, the logic inputs may be A=0 and B=0, where logic "0" represents ground and logic "1" represents the $V_{dd}$. The dual input $\overline{A}$ and $\overline{B}$ are logic "1." Transistor T1 and T4 are accordingly OFF while T2 and T3 are accordingly ON. MTJ1 (anti-parallel configuration) will therefore have higher resistance as compared to MTJ2 (parallel configuration).

The different phases of the multi-phased clock signal VCLK can be classified as a wait phase $t_1$, an evaluate phase $t_2$, a hold phase $t_3$, and a recover phase $t_4$. During the wait phase $t_1$, the clock signal VCLK is at ground (i.e., logic=0). During the evaluate phase $t_2$, the clock signal VCLK slowly increases from ground to $V_{dd}$. During the hold phase $t_3$, the clock signal VCLK is at $V_{dd}$. During the recover phase $t_4$, the clock signal VCLK slowly decreases from $V_{dd}$ to ground.

Accordingly, at different phases of the multiphase clock signal VCLK, the operation of the exemplary ALiM based XOR gate is as follows:

The ALiM based XOR gate has an initial state in which all nodes are initially at ground. When the input values are: A=0, $\overline{A}$=1, B=0 and $\overline{B}$=1, in the wait phase (i.e., $t_1$), the transistors T2, T3 and MN1 are ON. Accordingly, MTJ1 has an anti-parallel configuration (i.e., B=0) and MTJ2 has a parallel configuration (i.e., $\overline{B}$=1). The resistance of MTJ1 is therefore greater than the resistance of MTJ2 (i.e., $R_{MTJ1}>R_{MTJ2}$). Thus, in the wait phase, both XOR and XNOR outputs are 0.

Figures 6A, 6B:
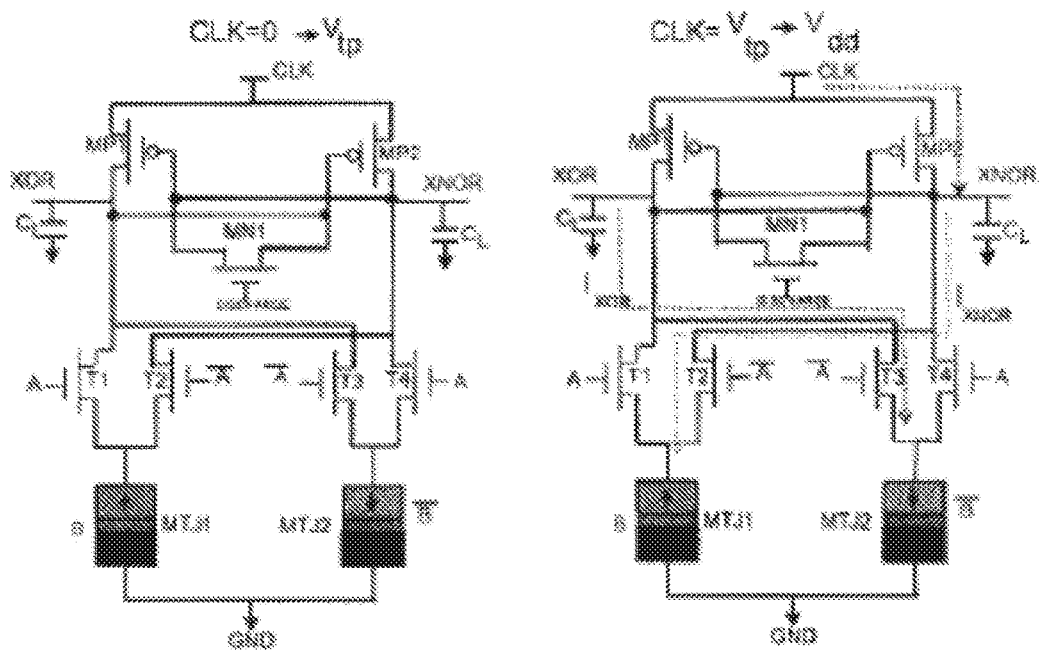

FIGS. 6A-B schematically illustrate the operation of the ALiM based XOR gate during the evaluate phase $t_2$. During the evaluation phase $t_2$, the clock signal VCLK gradually increases from 0 to the clock voltage $V_{dd}$. When the clock signal VCLK reaches a threshold voltage $V_{tp}$ of the cross-coupled PMOS devices, transistors MP1 and MP2 are ON and the current flows through transistors MP1 and MP2 to charge the load capacitors $C_L$. Since the $R_{MTJ1}>R_{MTJ2}$ and transistors T2 and T3 are ON, the charge stored in the XOR output is discharged to ground through transistor T3, and MTJ2 and XNOR is charged to $V_{dd}$. Thus, the XNOR output will follow the VCLK. Accordingly, in the evaluation phase, the XNOR output is 1 and the XOR output is 0, given the exemplary input values of: A=0, $\overline{A}$=1, B=0 and $\overline{B}$=1.

During a hold phase $t_3$, the clock signal VCLK is at $V_{dd}$ and the discharge signal DISCHARGE is at 0. While in the hold phase $t_3$, the outputs are held.

Figure 7A:
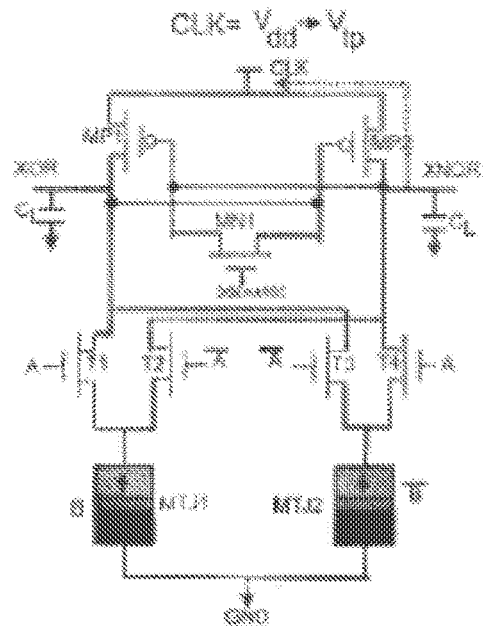
Figure 7B:
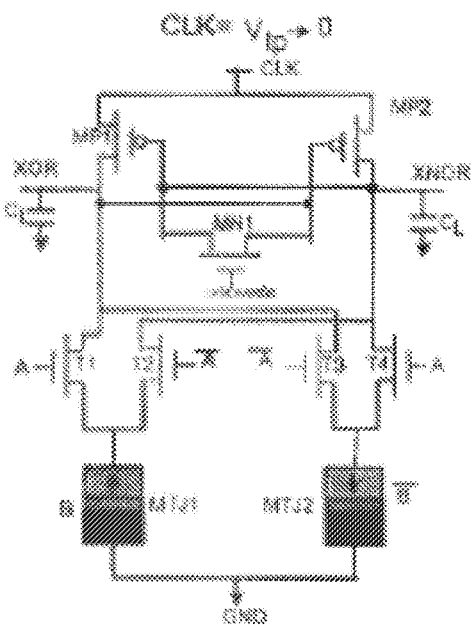

FIGS. 7A-B schematically illustrate the operation of the ALiM based XOR gate during the recover phase $t_4$.

During the recover phase $t_4$, the clock signal VCLK gradually decreases from $V_{dd}$ to 0. The charge stored in the output load capacitor of XNOR is slowly recovered back to the CLK through transistor MP2. The recovery of charge continues until the MP2 transistor is OFF, which occurs when $V_{scp}$ becomes less than the threshold voltage $V_{tp}$.

These steps continue in each cycle ensuring the proper operation of the circuit along with the energy-efficiency by using time ramp voltages to slowly charge and discharge the load capacitors.

Figure 8:
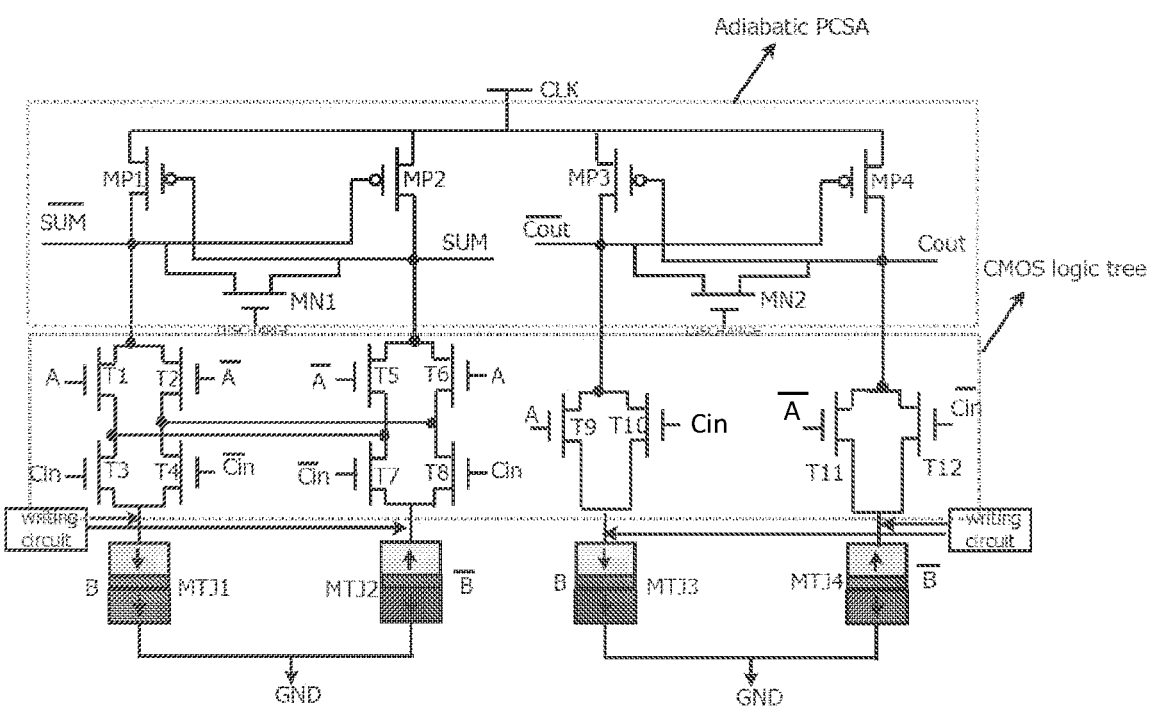

Adiabatic Logic-In-Memory Fully Adder:

FIG. 8 schematically illustrates the ALiM based CMOS/MTJ circuit according to at least one embodiment in which the ALiM CMOS/MTJ circuit is an ALiM Magnetic Full Adder (ALiM MFA) 130.

The dual rail CMOS logic 330 and non-volatile memory 430 implement the logic functions, while the adiabatic PCSA 230 reads the logic outputs SUM and $C_{out}$, and their complements. Due to the adiabatic logic principle, the energy dissipated in an adiabatic circuit when the charge is supplied by a constant current source is very small as compared to conventional CMOS based adders.

The logic inputs to the full adder circuit are A, B, and $C_{in}$ and respective complement inputs. The outputs are SUM and $C_{out}$ and their complements. The ALiM MFA circuit also receives a multiphase clock signal VCLK, which slowly charges and discharges the load capacitors in accordance with the principles described herein. Transistors MP1, MP2, MP3, MP4, MN1 and MN2 are operatively coupled to form the adiabatic PCSA. Transistors T1 through T12 along with MTJ1 through MTJ4 are operatively coupled to form the CMOS/MTJ logic structure for the SUM and CARRY outputs.

In other words, the ALiM MFA includes inputs A, B and $C_{in}$, and outputs SUM and $C_{out}$. Transistors MP1 and MP2 are configured to charge and recover charge from outputs SUM and $\overline{SUM}$. Discharge transistor MN1 is configured to permit charge sharing between outputs SUM and $\overline{SUM}$. Similarly, transistors MP3 and MP4 are configured to charge and recover charge from outputs $C_{out}$ and $\overline{C_{out}}$, while discharge transistor MN2 is configured to permit charge sharing between outputs $C_{out}$ and $\overline{C_{out}}$. Transistors T1 through T12 are configured to evaluate outputs SUM and $C_{out}$.

The CMOS tree structure of the ALiM MFA is based on the following equations:

$$SUM = A \cdot B \cdot C_{in} + \overline{B} \cdot A \cdot \overline{C_{in}} + \overline{A} \cdot B \cdot \overline{C_{in}} + \overline{A} \cdot C_{in} \cdot \overline{B} \quad (4)$$

$$C_{out} = A \cdot B + A \cdot C_{in} + B \cdot C_{in} \quad (5)$$

As an illustrative example, the input values may be: A=1, B=1 and $C_{in}$=1, and the timing diagram for the ALiM MFA may be in accordance with FIG. 4.

During the wait phase $t_1$ of the clock signal VCLK, the inputs A, B, and $C_{in}$ (and complements) of the ALiM MFA are passed to the circuit and the non-volatile data is stored in MTJ1, MTJ2, MTJ3 and MTJ4. MTJ1 and MTJ3 will have lower resistances as compared to the MTJ2 and MTJ4, due to the parallel orientation of MTJ1 and MTJ3 (B=1) as compared to the anti-parallel orientation of MTJ2 and MTJ4 ($\overline{B}$=0).

During the evaluate phase $t_2$ of the clock signal VCLK, the inputs A, B, and $C_{in}$ (and compliments) are evaluated by the CMOS logic tree. For A=1 and Cin=1, output $\overline{SUM}$ is discharged through the transistors T1 and T3, and are discharged faster than the SUM output. Thus, SUM is set to $V_{dd}$ (i.e., logic=1) and $\overline{SUM}$ is set to ground (i.e., logic=0). Similarly, output $\overline{C_{out}}$ is discharged to ground through transistor T9 and $C_{out}$ is charged to $V_{dd}$.

In other words, during the evaluate phase, the clock signal VCLK increases from 0 to $V_{dd}$. When the VCLK reaches $V_{tp}$, transistors MP2 and MP4 are turned ON. Thus, the SUM and $C_{out}$ outputs follow the clock signal VCLK.

During the hold phase $t_3$ phase of the clock signal VCLK, the outputs are held.

During the recover phase $t_4$, the clock signal VCLK slowly decreases from $V_{dd}$ to 0. The charge stored at SUM and $C_{out}$ is accordingly recovered in accordance with the principles discussed herein.

These steps continue in each cycle ensuring the proper operation of the circuit along with the energy-efficiency by using time ramp voltages to slowly charge and discharge the load capacitors.

Experimental Results

Simulations were performed on each of the ALiM XOR gate and the ALiM MFA. Simulations were performed using a Cadence Spectre simulator with 45 nm standard CMOS technology with perpendicular anisotropy CoFeB/MgO MTJ model. Table I shows the MTJ device parameters used.

In each of the test simulations, the size of the transistors, except the discharge transistors MN1 and MN2, were W/L=120 nm/45 nm. The discharge transistors MN1 and MN2 were W/L=300 nm/45 nm. The discharge transistors MN1 and MN2 were sized bigger to completely discharge and reset the outputs before the evaluation phase of the subsequent cycle. Simulations are performed at 250 MHz with $V_{dd}$=0.9 V.

TABLE I

MTJ DEVICE PARAMETERS USED FOR SIMULATIONS

| Parameter | Description | Value |
|---|---|---|
| $t_{sl}$ | Thickness of the free layer | 1.3 nm |
| a | Length of surface long axis | 40 nm |
| b | Width of surface short axis | 40 nm |
| $t_{ox}$ | Thickness of the Oxide barrier | 0.85 nm |
| TMR | Tunnel Magneto Resistance ratio | 150% |
| RA | Resistance Area Product | 5 ohm μm² |
| Area | MTJ layout surface | 40 nm × 40 nm × π/4 |
| $I_{co}$ | Critical switching current | Min. 40 μA |

Table II provides a performance comparison of the PCSA based XOR gate and the ALiM XOR gate. As Table II shows, the ALiM XOR gate has 62% and 50% of energy and power savings as compared to the PCSA based XOR gate. Further, the ALiM XOR gate has 31.7% area savings as compared to the PCSA based XOR gate.

TABLE II

PERFORMANCE COMPARISON OF PCSA BASED MFA AND ALIM BASED XOR GATE

| | PCSA based XOR [3] | ALIM based XOR (proposed) | % impr. |
|---|---|---|---|
| Avg. energy (fJ) | 0.98 | 0.363 | 62 |
| Avg. power (μW) | 0.36 | 0.18 | 50 |
| Device count | 11MOS + 2MTJ | 7MOS + 2MTJ | — |
| Area (μm²) | 5.29 | 3.61 | 31.7 |

Figure 9:
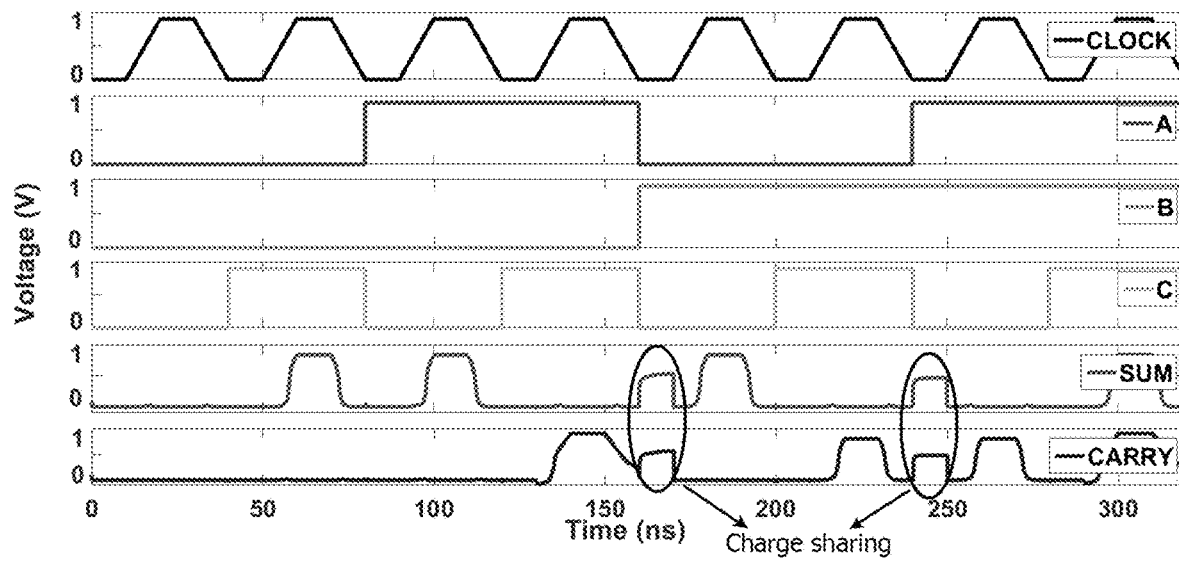
FIG. 9 illustrates simulated transient waveforms of the ALiM MFA of FIG. 8.

FIG. 9 illustrates the simulated transient waveforms of the ALiM MFA. The transient behavior of the outputs SUM and $C_{out}$ confirm the correct logical functionality of the proposed ALIM based full adder. This waveform verifies the functionality of the proposed ALIM based MFA. The correct functionality of the proposed ALIM based MTJ/CMOS full adder is verified from FIG. 9. CLOCK represents the VCLK, A, B, C represents the inputs to the full adder and SUM and CARRY are the outputs of the full adder. The complementary inputs and outputs are not shown.

Figure 10:
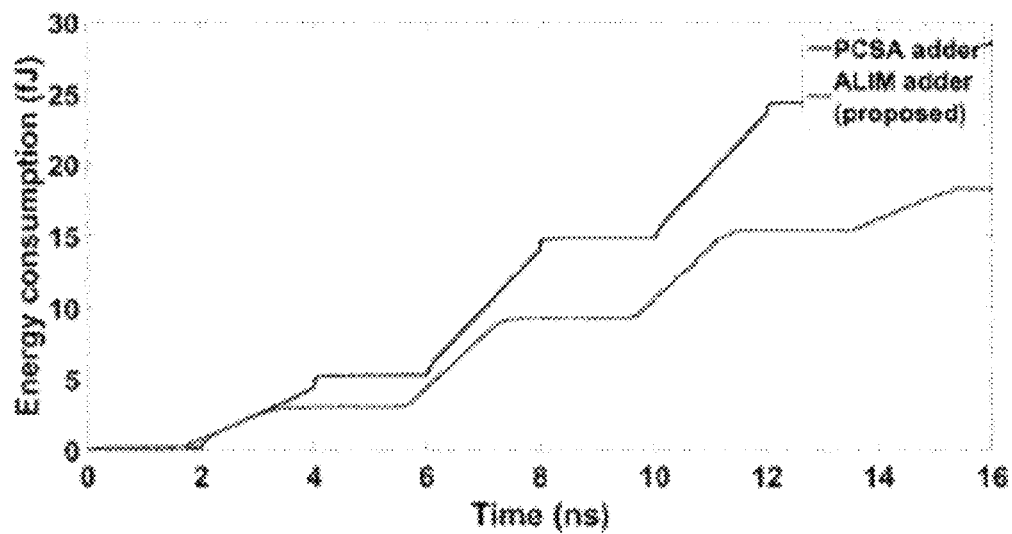
FIG. 10 illustrates simulated energy consumption of the ALiM MFA of FIG. 8, as compared to the energy consumption of a PCSA based MFA.

FIG. 10 illustrates the simulated energy consumption of the ALiM MFA as compared to the energy consumption of a PCSA based MFA. As shown in FIG. 10, for every switching of inputs, the energy consumption of the proposed ALiM MFA consumes less energy than the PCSA based MFA.

Table III provides a performance comparison of the PCSA based MFA and the ALiM MFA. As Table III shows, the ALiM MFA saves 37% of energy as compared to the PCSA based MFA. The ALiM MFA saves 43% of power consumption as compared to the PCSA based MFA.

TABLE III

PERFORMANCE COMPARISON OF PCSA BASED MFA AND ALIM BASED MFA

| | PCSA based MFA [3] | ALIM based MFA (proposed) | % impr. |
|---|---|---|---|
| Avg. energy (fJ) | 4.39 | 2.77 | 37 |
| Avg. power (μW) | 1.81 | 1.03 | 43 |
| Device count | 26MOS + 4MTJ | 18MOS + 4MTJ | — |
| Area (μm²) | 14.4 | 9 | 38 |

Along with reduced energy and power consumption, the ALiM MFA also used a smaller number of devices than the PCSA based MFA. The PCSA based MFA used 26 MOS devices and 4 MTJs. The ALiM MFA used 18 MOS devices and 4 MTJs. Moreover, the ALiM MFA had 38% area savings as compared to the PCSA based MFA.

Figure 11:
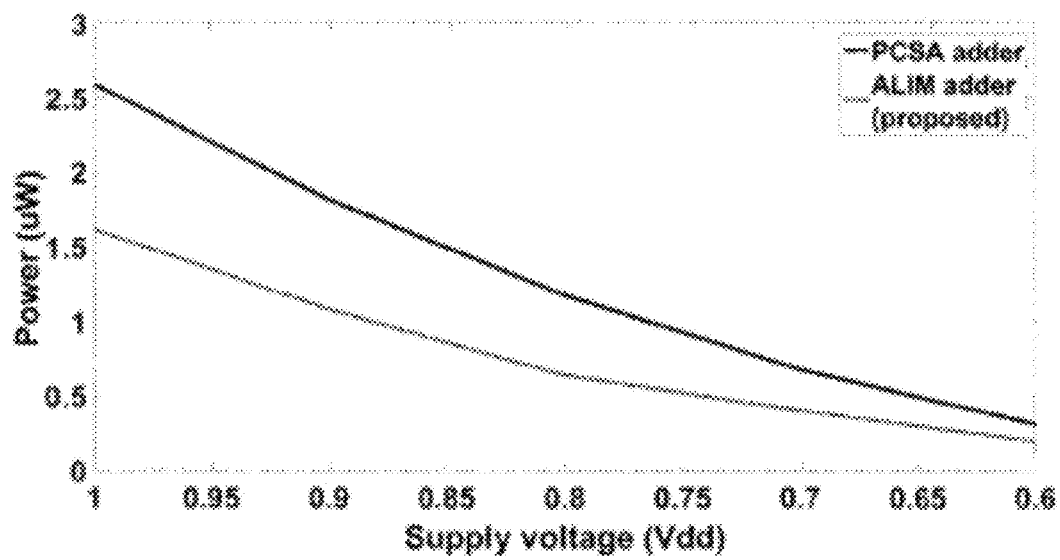
FIGS. 11-12 illustrate a graphical comparison between the average power and energy consumption of the ALiM MFA of FIG. 8 and the PCSA based MFA.
Figure 12:
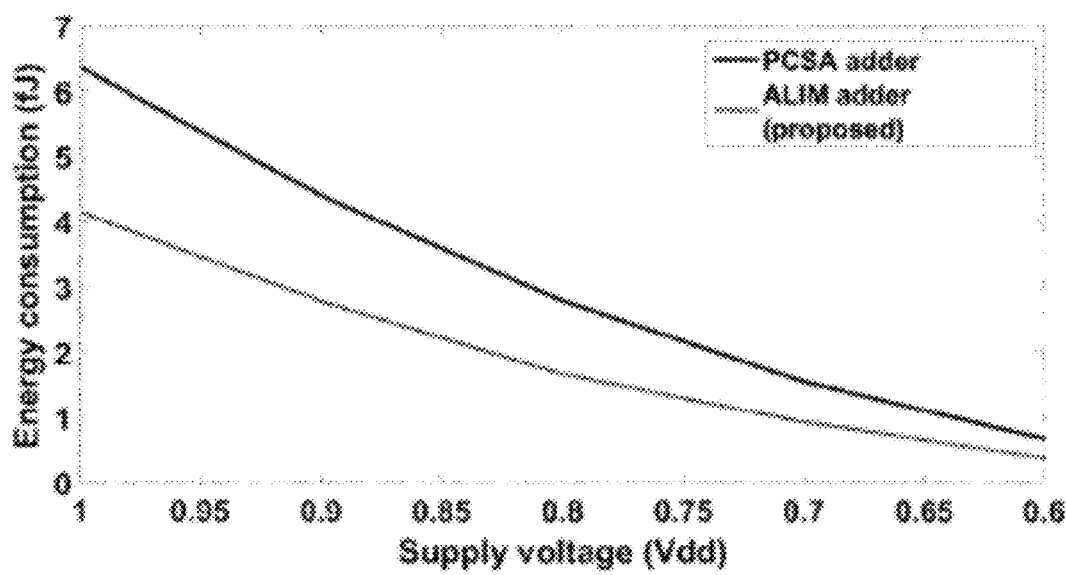

Turning now to FIGS. 11-12, these graphs illustrate a comparison between the average power and energy consumption of the ALiM MFA with the PCSA based MFA. By scaling of supply voltage $V_{dd}$, the energy and power consumption of both the PCSA based MFA and the ALiM MFA are decreased. However, the ALiM MFA still shows energy and power savings when scaled as compared to the PCSA based MFA.

A novel architecture for forming ALiM based CMOS/MTJ circuits is disclosed herein. These ALiM based CMOS/MTJ circuits have increased energy and power savings in comparison to the existing PCSA based CMOS/MTJ circuits for corresponding logic. The low-power consumption, low-energy consumption and low area of the ALiM based CMOS/MTJ circuits makes them particularly suited for use in ultra-low-power portable electronic devices.

While the principles of the ALiM based CMOS/MTJ circuits are described herein with specific reference to XOR and MFA logics, ALiM CMOS/MTJ circuits corresponding to other logics are expressly contemplated. For example, the ALiM based CMOS/MTJ circuit may include CMOS logic corresponding to any of the known gates, multi-bit adders, and flip-flops, as discussed above.

For example, FIGS. 13-15 schematically illustrate ALiM based CMOS/MTJ circuits according to embodiments wherein the ALiM based CMOS/MTJ circuits are, respectively, ALiM OR gates, AND gates, and multiplexers. The structure and operation of these specific circuits, as well as ALiM based CMOS/MTJ circuits according to other mentioned and unmentioned logic operations, would be readily understood by those of ordinary skill in the art with reference to the principles and illustrative examples discussed herein.

The enablements described in detail above are considered novel over the prior art of record and are considered critical to the operation of at least one aspect of the invention and to the achievement of the objectives of the invention. The words used in this specification to describe the exemplary embodiments are to be understood not only in the sense of their commonly defined meanings, but also to include any special definition with regard to structure, material or acts that would be understood by one of ordinary skilled in the art to apply in the context of the entire disclosure.

The definitions of the words or drawing elements described herein are meant to include not only the combination of elements which are literally set forth, but all equivalent structures, materials or acts for performing substantially the same function in substantially the same way to obtain substantially the same result. In this sense it is therefore contemplated that an equivalent substitution of two or more elements may be made for any one of the elements described and its various embodiments or that a single element may be substituted for two or more elements in a claim without departing from the scope of the invention.

Changes from the claimed subject matter as viewed by a person with ordinary skill in the art, now known or later devised, are expressly contemplated as being equivalents within the scope intended and its various embodiments. Therefore, obvious substitutions now or later known to one with ordinary skill in the art are defined to be within the scope of the defined elements. This disclosure is thus meant to be understood to include what is specifically illustrated and described above, what is conceptually equivalent, what can be obviously substituted, and also what incorporates the essential ideas.

The scope of this description is to be interpreted in conjunction with the appended claims.

What is claimed is:

1. An adiabatic logic-in-memory based complementary metal-oxide-semiconductor/magnetic-tunnel-junction (ALiM CMOS/MTJ) circuit, comprising:
    a set of magnetic-tunnel-junctions (MTJs) configured to store non-volatile data;
    a logic network, comprising the set of MTJs and a set of complementary metal-oxide-semiconductor (CMOS) transistors configured to together perform logic operations so as to generate logic outputs based on logic inputs; and
    an adiabatic logic based pre-charged sense amplifier (PCSA) operatively coupled to the logic network, the adiabatic logic based PCSA comprising:
        PCSA circuitry for which an input is a multi-phase power clock, the PCSA circuitry including cross-coupled transistors coupled to a common discharge transistor;
        charge recovery circuitry, including output load capacitors,
        wherein the charge recovery circuitry is operatively coupled to the PCSA circuitry such that the ALiM CMOS/MTJ circuit uses the power clock to recover energy from output load capacitors.

2. The adiabatic logic-in-memory based ALiM CMOS/MTJ circuit of claim 1, wherein the logic network operates as an OR gate.

3. The adiabatic logic-in-memory based ALiM CMOS/MTJ circuit of claim 1, wherein the logic network operates as an XOR gate.

4. The adiabatic logic-in-memory based ALiM CMOS/MTJ circuit of claim 1, wherein the logic network operates as a NOR gate.

5. The adiabatic logic-in-memory based ALiM CMOS/MTJ circuit of claim 1, wherein the logic network operates as an XNOR gate.

6. The adiabatic logic-in-memory based ALiM CMOS/MTJ circuit of claim 1, wherein the logic network operates as an AND gate.

7. The adiabatic logic-in-memory based ALiM CMOS/MTJ circuit of claim 1, wherein the logic network operates as a NAND gate.

8. The adiabatic logic-in-memory based ALiM CMOS/MTJ circuit of claim 1, wherein the logic network operates as a NOT gate.

9. The adiabatic logic-in-memory based ALiM CMOS/MTJ circuit of claim 1, wherein the logic network operates as a MUX gate.

10. The adiabatic logic-in-memory based ALiM CMOS/MTJ circuit of claim 1, wherein the logic network operates as an inverter logic.

11. The adiabatic logic-in-memory based ALiM CMOS/MTJ circuit of claim 1, wherein the logic network operates as an encoder logic.

12. The adiabatic logic-in-memory based ALiM CMOS/MTJ circuit of claim 1, wherein the logic network operates as a decoder logic.

13. The adiabatic logic-in-memory based ALiM CMOS/MTJ circuit of claim 1, wherein the logic network operates as a full-adder logic.

14. The adiabatic logic-in-memory based ALiM CMOS/MTJ circuit of claim 1, wherein the logic network operates as a half-adder logic.

15. The adiabatic logic-in-memory based ALiM CMOS/MTJ circuit of claim 1, wherein the logic network operates as a full-subtractor logic.

16. The adiabatic logic-in-memory based ALiM CMOS/MTJ circuit of claim 1, wherein the logic network operates as a half-subtractor logic.

17. The adiabatic logic-in-memory based ALiM CMOS/MTJ circuit of claim 1, wherein the logic network operates as a D-flip-flop logic.

* * * * *